(12) United States Patent
Matsuo et al.

(10) Patent No.: US 6,479,318 B2
(45) Date of Patent: Nov. 12, 2002

(54) METHOD OF MANUFACTURING A SUBSTRATE WITH DIRECTIONALLY ANISOTROPIC WARPING

(75) Inventors: Itaru Matsuo, Hyogo (JP); Hiroshi Ryu, Hyogo (JP); Kayo Miyamura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/838,388

(22) Filed: Apr. 20, 2001

(65) Prior Publication Data

US 2002/0064899 A1 May 30, 2002

(30) Foreign Application Priority Data

Nov. 28, 2000 (JP) .......................................... 2000-361111

(51) Int. Cl.[7] .......................... H01L 21/44; H01L 21/30
(52) U.S. Cl. ...................... 438/106; 438/111; 438/457
(58) Field of Search ................................ 438/457, 106, 438/107, 111; 29/743, 759; 264/285, 339

(56) References Cited

U.S. PATENT DOCUMENTS

| | | | | |
|---|---|---|---|---|
| 4,399,089 A | * | 8/1983 | Mohri et al. | 264/57 |
| 5,071,785 A | * | 12/1991 | Nakazato et al. | 437/62 |
| 5,382,551 A | * | 1/1995 | Thakur et al. | 437/247 |
| 6,291,877 B1 | * | 9/2001 | Usami et al. | 257/679 |

FOREIGN PATENT DOCUMENTS

JP 6-326443 11/1994

* cited by examiner

Primary Examiner—Michael Sherry
Assistant Examiner—Scott B. Geyer
(74) Attorney, Agent, or Firm—Leydig, Voit & Mayer, Ltd.

(57) ABSTRACT

A semiconductor device substrate which can be easily conveyed and a semiconductor device fabrication method using the substrate. The semiconductor device fabrication method includes forming a solder resist on a semiconductor element mounting plate-shaped substrate having major and minor sides and containing organic matter, having a linear expansion coefficient A different from that of the substrate, warping the substrate along a minor-side direction, and conveying the warped substrate.

12 Claims, 7 Drawing Sheets

US 6,479,318 B2

METHOD OF MANUFACTURING A SUBSTRATE WITH DIRECTIONALLY ANISOTROPIC WARPING

BACKGROUND OF THE INVENTION

1. Field of the Invention

The present invention relates to a semiconductor device substrate and a semiconductor device fabrication method, particularly to a semiconductor device substrate in which a solder resist is applied onto a predetermined substrate and a semiconductor device fabrication method using the substrate.

2. Description of the Background Art

Demands on semiconductor devices have been recently increased in the field of electronics. A semiconductor device is generally constituted by forming a wiring layer made of a metal, such as copper, on an insulating substrate, such as a glass-epoxy substrate, and mounting of a semiconductor element on the wiring layer. The semiconductor element and the wiring layer are connected to each other by solder or a bonding wire. In this case, so-called solder resist is formed on the substrate in order to prevent a chemical change of the wiring-layer surface and to prevent formation of a solder bridge between adjacent solder junctions.

FIG. 13 is a perspective view of a conventional semiconductor device substrate on which a solder resist is formed. Referring to FIG. 13, a semiconductor device substrate 10 has a plate-shaped substrate 1 and a solder resist 5 formed on the substrate 1. The substrate 1 is almost rectangular and has a major side 1a and a minor side 1b. The substrate 1 is made of the so-called glass-epoxy substrate formed by impregnating glass fiber with epoxy resin and has a superior insulating property. A printed wiring layer (not illustrated) is formed on the surface of the substrate 1. To protect the surface of the printed wiring layer, a solder resist 5 is applied to the surface of the substrate 1. The solder resist 5 is made of, for example, epoxy resin and a hole 5a is formed on the solder resist 5. The hole 5a exposes the printed wiring layer formed on the surface of the substrate 1. Thereby, it is possible to electrically connect the exposed printed wiring layer with a semiconductor device mounted on the layer. Moreover, because the printed wiring layer is covered with the solder resist 5 at other portions, it is possible to prevent the surface of the printed-wiring layer from oxidizing. The solder resist 5 is formed on the surface of the substrate 1 through screen printing.

Problems of the prior art are described below by referring to the accompanying drawings.

FIG. 14 is a perspective view of a substrate shown to explain problems of the prior art. Referring to FIG. 14, the substrate 1 is greatly different from the solder resist 5 in linear expansion coefficient in general. Specifically, the substrate 1 has a smaller linear expansion coefficient because it contains glass fiber. However, the solder resist 5 has a linear expansion coefficient larger than that of the substrate 1 because the solder resist 5 is made of only an organic matter. Therefore, the substrate 1 is warped due to cooling or heating in the cooling process after forming the solder resist 5 or the bonding process for mounting a semiconductor element on the solder resist 5 after formed. Therefore, when housing the semiconductor device substrate 10 in a magazine 50 by mounting the substrate 10 on a rail 30, pushing it with a pusher 40, and conveying it in the direction shown by an arrow 11, the substrate 10 is warped and thereby, it is difficult to automatically convey the substrate 10. As a result, problems occur that the substrate 10 is incorrectly conveyed and fabrication processes are complicated.

SUMMARY OF THE INVENTION

Therefore, the present invention is made to solve the above problems and its object is to provide a semiconductor device substrate to be easily conveyed and a semiconductor device fabrication method using the substrate.

A semiconductor device fabrication method according to an aspect of the present invention includes the steps of forming a layer having a linear expansion coefficient A different from that of a semiconductor element mounting, plate-shaped substrate having major and minor sides and containing an organic matter on the substrate, warping the substrate with the layer formed on it along its minor-side direction, and conveying the warped substrate.

According to the above steps, the substrate is not warped along its major-side direction because it is warped along its minor-side direction. As a result, it is possible to decrease the whole warp of the substrate and easily convey the substrate.

It is preferable that the step of warping the substrate in its minor-side direction includes previously adjusting linear expansion coefficients of a substrate so that the difference between the linear expansion coefficient A and the linear expansion coefficient B of the substrate in its minor-side direction becomes relatively large and the difference between the linear expansion coefficient A and the linear expansion coefficient C of the substrate in its major-side direction becomes relatively small. In this case, only by adjusting linear expansion coefficients of the substrate, it is possible to securely warp the substrate along its minor-side direction in the subsequent step.

Moreover, it is more preferable that previously adjusting linear expansion coefficients of a substrate includes adjusting linear expansion coefficients in major- and minor-side directions by arranging a plurality of first fibers extending in the major-side direction of the substrate and a plurality of second fibers extending in the minor-side direction of the substrate in the substrate and adjusting densities of the first and second fibers. In this case, it is possible to easily control linear expansion coefficients in major- and minor-side directions only by adjusting densities of the first and second fibers.

It is still more preferable that the first and second fibers are glass fibers and the substrate contains matrix epoxy resin for covering the glass fibers.

It is still more preferable that the step of warping the substrate in its minor-side direction includes pressing the surface of the substrate so that the substrate is warped along its minor-side direction. In this case, by pressing the surface of the substrate, it is possible to warp the substrate along its minor-side direction through a simple step.

It is still more preferable that the step of warping the substrate along its minor-side direction includes attracting the surface of the substrate so that the substrate is warped in its minor-side direction. In this case, by attracting the surface of the substrate, it is possible to warp the substrate along its minor-side direction through a simple step.

It is still more preferable that the step of warping the substrate along its minor-side direction includes heating the substrate and then cooling the substrate and warping the substrate. In this case, because the substrate is heated, then cooled, and warped, the warped substrate is not easily warped in other directions. As a result, it is possible to securely warp the substrate.

It is still more preferable that a layer contains at least one selected from the group consisting of melamine resin, epoxy resin, acrylic resin, and polyimide resin. In this case, because these resins respectively constitute a solder resist, it is possible to form a solder resist on the substrate.

It is still more preferable that a semiconductor device fabrication method further includes a step of forming a conductive layer on a substrate before forming a layer and a step of forming a layer includes forming the layer so as to expose a part of the surface of the conductive layer. In this case, it is possible to protect the conductive layer by the layer and electrically connect a semiconductor element to the exposed part of the surface of the conductive layer.

It is still more preferable that the step of forming the layer includes forming a layer having a hole reaching the conductive layer on the substrate on which the conductive layer is formed. The semiconductor device fabrication method further includes mounting a semiconductor device on the substrate electrically connected with the conductive layer through the hole. In this case, the semiconductor device is completed by mounting the semiconductor element on the substrate electrically connected to the conductive layer through the hole.

A semiconductor device fabrication method according to another aspect of the present invention includes forming a layer having a linear expansion coefficient almost equal to that of a semiconductor element mounting, plate-shaped substrate containing organic matter, on the substrate and conveying the substrate on which the layer is formed.

According to the above steps, the substrate is not warped even if heating and cooling the substrate because the linear expansion coefficient of the substrate is almost equal to that of the layer formed on the substrate. Therefore, a semiconductor device fabrication method capable of easily conveying a substrate is obtained.

It is preferable that the layer contains polyimide resin. In this case, because the linear expansion coefficient of the polyimide resin can be set in a wide range, it is possible to almost equalize the linear expansion coefficient of the polyimide resin with that of a substrate.

It is more preferable that forming the layer includes forming a layer on a substrate having linear expansion coefficients that have been previously adjusted. The substrate has major and minor sides. Previously adjusting the linear expansion coefficients of the substrate includes arranging a plurality of first fibers extending along a major-side direction and a plurality of second fibers extending along a minor-side direction in the substrate and adjusting linear expansion coefficients of the substrate along the major- and minor-side directions by adjusting densities of the first and second fibers. In this case, by adjusting densities of the first and second fibers, it is reliably possible nearly to equalize the linear expansion coefficients of the substrate and those of the layer.

It is still more preferable that the first and second fibers are glass fibers and the substrate contains matrix epoxy resin for covering the glass fibers.

It is still more preferable that a semiconductor device fabrication method further includes a step of forming a conductive layer on the substrate before forming a layer. The step of forming a layer includes forming the layer so as to expose a part of the surface of the conductive layer. In this case, it is possible to protect the conductive layer by the layer and electrically connect a semiconductor element to the exposed part of the surface of the conductive layer.

It is still more preferable that forming a layer includes forming a layer having a hole reaching the conductive layer on the substrate on which conductive layer is formed. The semiconductor device fabrication method further includes mounting a semiconductor element on the substrate electrically connected to the conductive layer via the hole. In this case, the semiconductor device is completed by mounting the semiconductor device on the element.

A semiconductor device substrate according to the present invention is provided with a plate-shaped substrate having major and minor sides and containing an organic matter and a layer formed on the surface of the substrate and having a linear expansion coefficient A different from that of the substrate. The substrate is warped along its minor-side direction.

Because the semiconductor device substrate thus constituted is warped along its minor-side direction, the substrate is not warped along its major-side direction. As a result, it is possible to easily convey the substrate.

It is still more preferable that the substrate has a minor-side-directional linear expansion coefficient B and a major-side-directional linear expansion coefficient C and the difference between a linear expansion coefficient A and linear expansion coefficient B is relatively large and the difference between the linear expansion coefficient A and linear expansion coefficient C is relatively small. In this case, because the difference between minor-side-directional linear expansion coefficients becomes larger than the difference between major-side-directional linear expansion coefficients, it is possible to securely warp the substrate along its minor-side direction.

It is still more preferable that the substrate includes a plurality of first fibers extending in its major-side direction and a plurality of second fibers extending in its minor-side direction. By adjusting densities of the first and second fibers, major- and minor-side-directional linear expansion coefficients are adjusted. In this case, by adjusting densities of the first and second fibers, it is possible to adjust linear expansion coefficients of the substrate by a simple method.

It is still more preferable that the first and second fibers are glass fibers and the substrate contains matrix epoxy resin for covering the glass fibers.

It is still more preferable that the layer includes at least one of melamine resin, epoxy resin, acrylic resin, and polyimide resin.

It is still more preferable that the semiconductor device substrate is further provided with a conductive layer formed between the substrate and the layer. A hole for the semiconductor element to electrically connect with the conductive layer is formed on the layer.

A semiconductor device substrate according to still another aspect of the present invention is provided with a plate-shaped substrate containing an organic matter and a layer formed on the surface of the substrate and having a linear expansion coefficient almost equal to that of the substrate.

The semiconductor device substrate constituted as described above is not warped because the linear expansion coefficient of the substrate is almost equal to that of the layer formed on the substrate. Therefore, it is easy to convey the substrate.

It is still more preferrable that the layer contains polyimide resin. In this case, because the linear expansion coefficient of the polyimide resin can be set to any value, it is easy to almost equalize linear expansion coefficients of the layer and substrate.

It is still more preferable that the substrate have major and minor sides and include a plurality of first fibers extending along a major-side direction and a plurality of second fibers extending along a minor-side direction. By adjusting densities of the first and second fibers, major-and minor-side directional linear expansion coefficients are adjusted. In this case, by adjusting densities of the first and second fibers, it is possible to equalize linear expansion coefficients of the substrate and the layer.

It is still more preferable that the first and second fibers are glass fibers and the substrate contains matrix epoxy resin for covering the glass fibers.

It is still more preferable that the semiconductor device substrate is provided with a conductive layer formed between the substrate and the layer. A hole for the semiconductor element to electrically connect with the conductive layer is formed on the layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are described below by referring to the accompanying drawings.

(First Embodiment)

Figure 1:
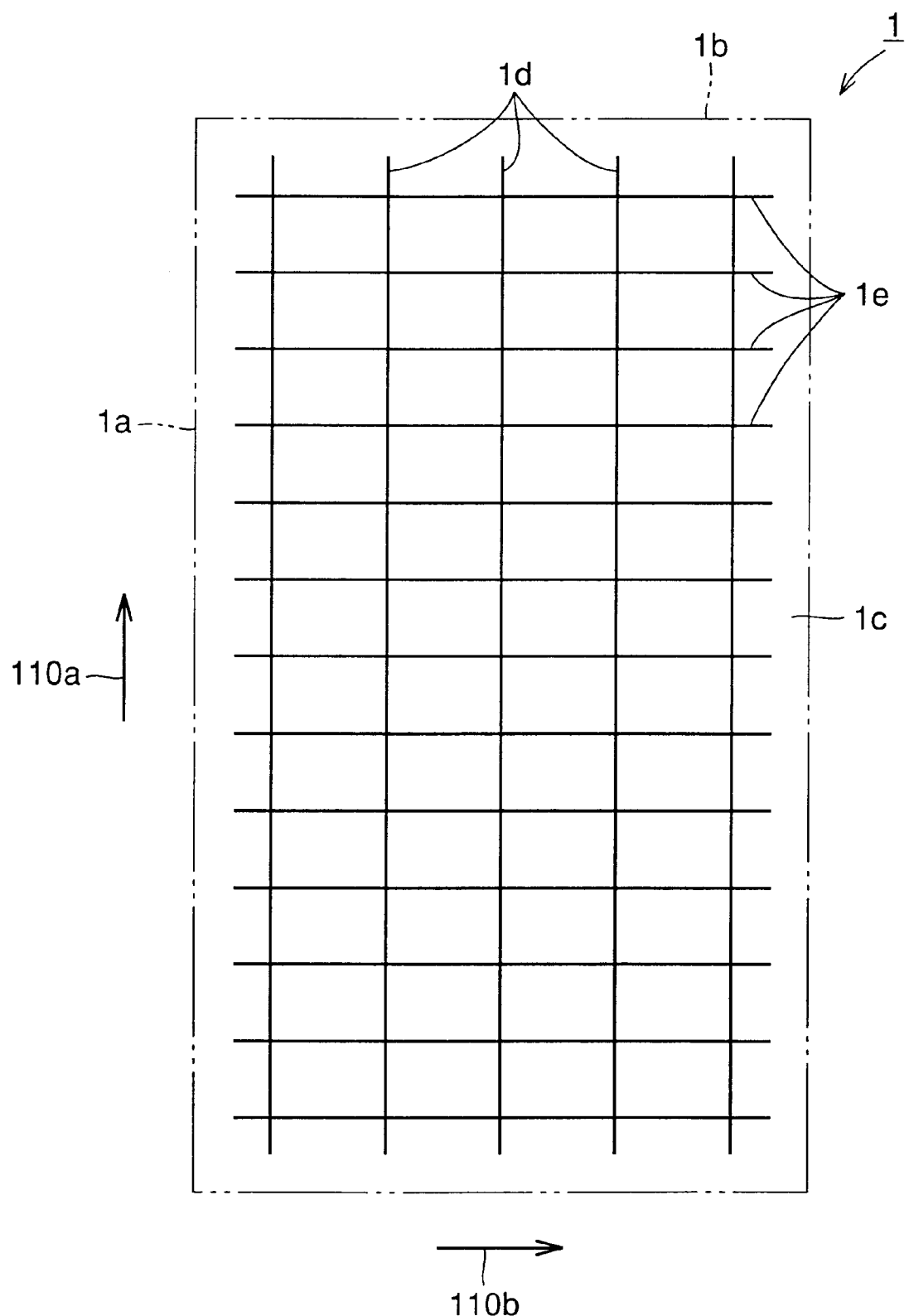
FIG. 1 is a top view showing the first step of a semiconductor device fabrication method according to a first embodiment of the present invention.

Referring to FIG. 1, a substrate 1 made of glass-epoxy is first prepared. The substrate 1 is constituted of glass fibers 1d and 1e arranged in the substrate 1 and epoxy resin 1c covering the glass fibers 1d and 1e. The glass fibers include a plurality of first fibers extending along a major-side direction 1a of the substrate 1 and a plurality of second fibers 1e extending along a minor-side direction 1b of the substrate 1. When densities of the glass fibers 1d and 1e are adjusted, linear expansion coefficients along the major-side direction of the substrate 1, shown by an arrow 110a, and the minor-side direction of the substrate 1, shown by an arrow 110b, are adjusted. A stranded line with 400 glass fibers, respectively having a diameter of approx. 7 $\mu$m, constitute the glass fibers 1d and 1e. Forty-seven glass fibers 1d are arranged over 2.54 cm (1 inch) in the minor-side direction shown by the arrow 110b and 60 glass fibers 1e are arranged over 2.54 cm (1 inch) in the major-side direction shown by the arrow 110a. Thereby, the linear expansion coefficient of the substrate 1 in its major-side direction shown by the arrow 110a becomes $11 \times 10^{-6}/°$ C. The linear expansion coefficient of the substrate 1 in its minor-side direction shown by the arrow 110b becomes $10 \times 10^{-6}/°$ C. Thus, by adjusting the density of glass fibers, linear expansion coefficients in the major-side direction, shown by the arrow 110a, and the minor-side direction, shown by the arrow 110b, are adjusted.

Figure 2:
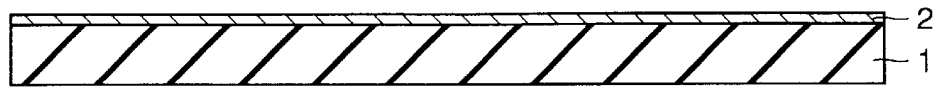
FIGS. 2 to 4 are sectional views showing the second to fourth steps of the semiconductor device fabrication method according to the first embodiment of the present invention.

Referring to FIG. 2, by covering the entire surface of the substrate 1, a copper film 2 is formed through chemical vapor deposition.

Figure 3:
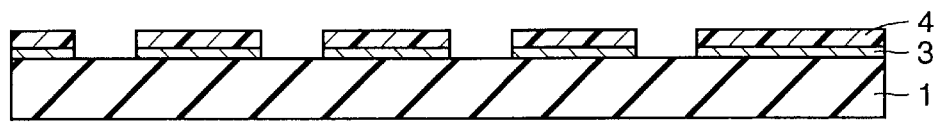

Referring to FIG. 3, a resist pattern 4 is formed by applying a resist onto a copper film 2 and patterning the resist into a predetermined shape. A conductive layer 3 serving as a printed wiring is formed by etching the copper film 2 in accordance with the resist pattern 4.

Figure 4:
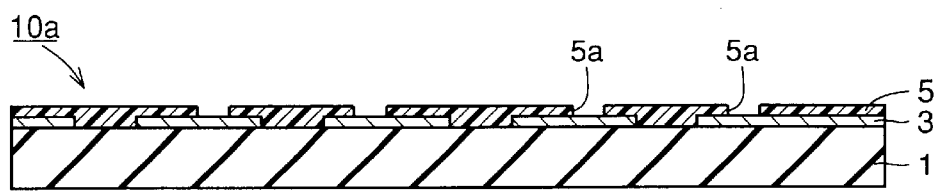

Referring to FIG. 4, a solder resist 5 is applied onto the substrate 1 and conductive layer 3 through screen printing. The solder resist 5 contains any one of melamine resin, epoxy resin, acrylic resin, and polyimide resin. The solder resist 5 has a linear expansion coefficient ($30 \times 10^{-6}/°$ C.) different from that of the substrate 1. That is, in this step, the solder resist 5 serving as a layer having the linear expansion coefficient A ($30 \times 10^{-6}/°$ C.) different from that of the semiconductor device mounting, plate-shaped substrate 1 having major and minor sides and containing an organic matter is formed on the substrate 1. A hole 5a reaching the conductive layer 3 is formed on the solder resist 5. Thereby, a semiconductor device substrate 10a is completed. The hole 5a exposes a part of the surface of the conductive layer 3.

Figure 5:
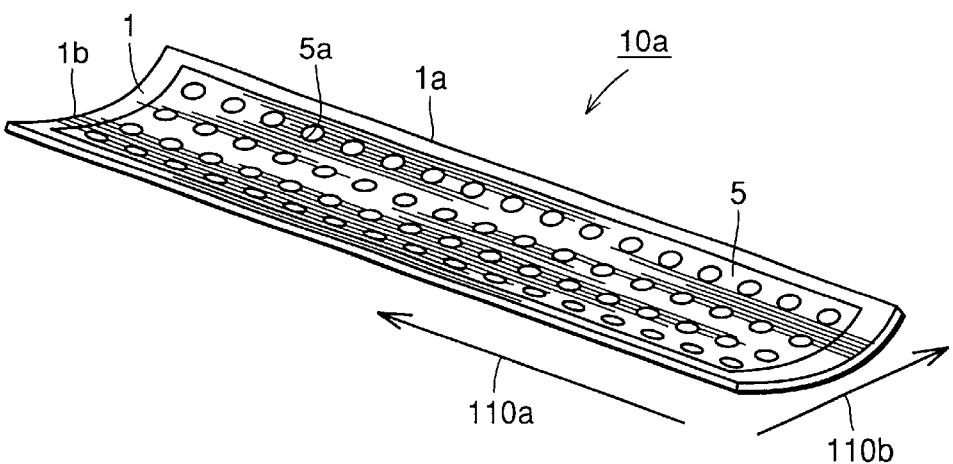
FIGS. 5 and 6 are perspective views of the fifth to sixth steps of the $semiconductor device fabrication method according to the first embodiment of the present invention.

Referring to FIG. 5, because of a subsequent temperature change, the substrate 1 is warped due to the difference between linear expansion coefficients of the substrate 1 and the solder resist 5. In this case, because linear expansion coefficients of the substrate 1 are previously adjusted so that the difference between the linear expansion coefficient A ($30 \times 10^{-6}/°$ C.) of the solder resist 5 and linear expansion coefficient B ($10 \times 10^{-6}/°$ C.) of the substrate 1 in the direction of its minor-side direction 1b becomes relative large and the difference between the linear expansion coefficient A of the solder resist 5 and linear expansion coefficient C ($11 \times 10^{-6}/°$ C.) of the substrate 1 in the direction of its major-side direction 1a becomes relatively small, the semiconductor device substrate 10a is warped along the minor-side direction shown by the arrow 110b.

Figure 6:
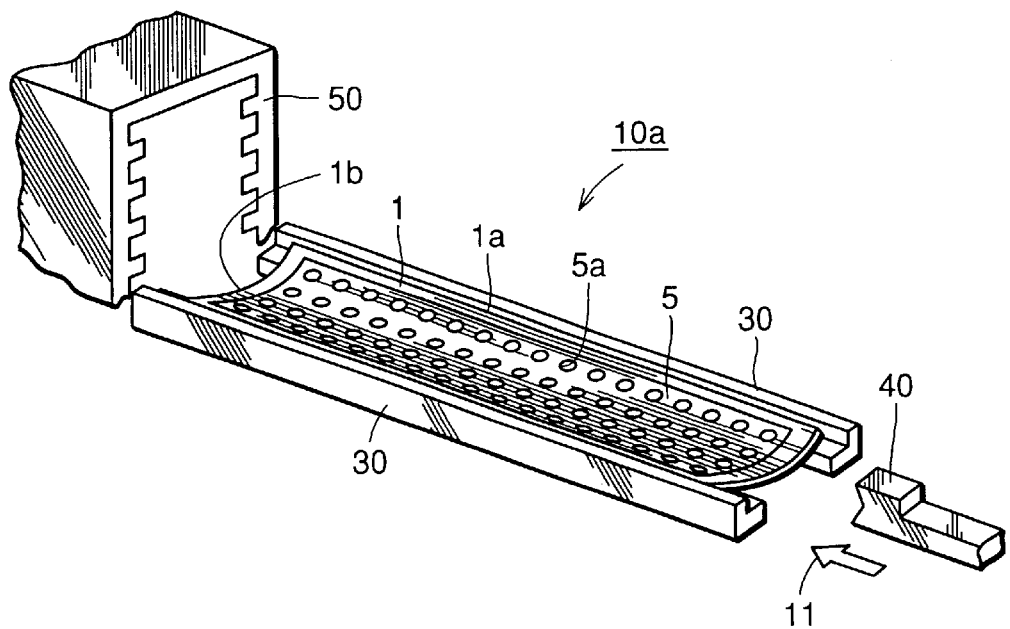

The warped semiconductor device substrate 10a is mounted on a rail 30 as shown in FIG. 6. The semiconductor device substrate 10a mounted on the rail 30 is conveyed in the direction shown by the arrow 11 by a pusher 40. Thereby, the semiconductor device substrate 10a is housed in a magazine 50 and conveyed.

Figure 7:
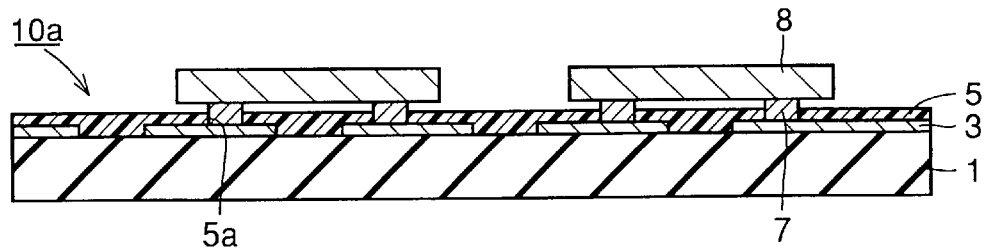
FIG. 7 is a sectional view showing the seventh step of the semiconductor device fabrication method according to the first embodiment of the present invention.

Referring to FIG. 7, a semiconductor element 8 is mounted on the substrate 1. In this case, the conductive layer 3 is electrically connected with the semiconductor element 8 by a solder 7 through the hole 5a. Thereby, the bonding process of the semiconductor device is completed.

Moreover, in the step shown in FIG. 7, the semiconductor device is fabricated and thereafter conveyed again in accordance with the step shown in FIG. 6. In this case, even if a high temperature is applied to the substrate 10a in order to melt the solder in the step shown in FIG. 6, it is not warped in its major-side direction though it is only warped in its minor-side direction.

In the case of the semiconductor device substrate 10a and the semiconductor device fabrication method using the substrate 10a according to the present invention described above, the semiconductor device substrate 10a is not greatly warped along the major-side direction shown by the arrow 110a because the substrate 10a is warped along its minor-side direction shown by the arrow 110b. As a result, a jig and a person for correcting a warp are unnecessary compared to a method of planarizing and conveying a substrate warped in its major-side direction. As a result, conveying a substrate becomes easy and it is possible to prevent the fabrication cost from listing.

Moreover, it is possible to reduce the cost of a conveying mechanism because the conveying mechanism can be easily downsized compared to the case of constituting a conveying system capable of conveying a substrate warped in its major-side direction.

Furthermore, it is possible to save the energy for a conveying mechanism to be driven compared to the case of a conveying system capable of conveying a warped substrate.

Furthermore, there is a method for reducing a warp by increasing the thickness of the substrate 1 and improving its rigidity. However, in the case of the present invention, it is unnecessary to increase the thickness of the substrate 1. As a result, it is possible to decrease the substrate 1 in thickness and decrease a semiconductor package in thickness, size, and weight.

Furthermore, because a process for collecting the warped substrate 1 is unnecessary, a mechanism for correcting a warp is also unnecessary.

Furthermore, because the process for correcting the warped substrate 1 is not used, a processing time is unnecessary and it is possible to prevent the throughput from lowering.

Furthermore, because the process for correcting the warped substrate 1 is not used, the substrate 1, semiconductor element 8 mounted on the substrate 1, and conductive layer 3 for connecting the substrate 1 with the semiconductor element 8 are not damaged or stressed. As a result, it is possible to provide a high-reliability semiconductor device.

In the case of this embodiment, the substrate 1 is warped before the semiconductor element 8 is formed on the substrate 1. However, the substrate 1 may be warped after mounting the semiconductor element 8 on the substrate 1. Moreover, the substrate 1 may be warped when cooling the substrate 1 after heating the substrate 1 in the bonding process for mounting the semiconductor element 8 on the substrate 1.

(Second Embodiment)

Figure 8:
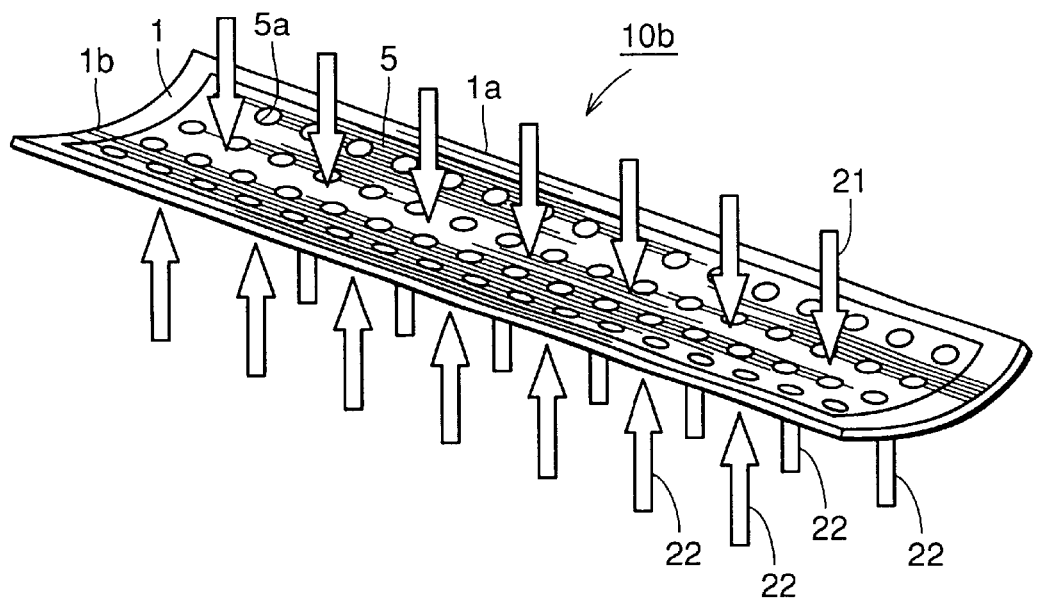
FIG. 8 is a perspective view for explaining a semiconductor device substrate and a semiconductor device fabrication method according to a second embodiment of the present invention.

Referring to FIG. 8, this embodiment is different from the first embodiment in that a substrate 1 is warped in the direction of its minor side 1b by applying an external force to the substrate 1 from directions shown by arrows 21 and 22 and pressing the surface of the substrate 1.

It is more preferable that the substrate 1 is heated to a temperature higher than the softening point (Tg) of glass fibers included in the substrate 1 and then cooled and warped. The external force is applied to the central portion of the substrate 1 from the direction shown by the arrow 21 and an external force is applied to the margin of the substrate 1 from the direction shown by the arrow 22. Thereby, the substrate 1 is warped along the direction of its minor side 1b.

First, a semiconductor device substrate 10b and a semiconductor device fabrication method using the substrate 10b have the same advantages as those of the semiconductor device substrate and semiconductor device fabrication method shown in the first embodiment. Moreover, they have the following advantage for the art of pressing and correcting the warped substrate 1 and planarizing the substrate 1.

First, in the case of a method of moderating a warp through pressing, it is necessary to press the entire surface of a substrate and the pressure necessary for correction is very large. In the case of the present invention, however, because loads are concentrated on a part of the substrate 1 by pressing a specified portion of the substrate 1, the energy required to supply the loads becomes small. As a result, it is possible to downsize a pressing mechanism and save energy.

Moreover, in the case of the art of pressing and planarizing a substrate, the substrate is easily warped again and thereby, a cooling period of 10 to 30 sec is required after the warped substrate is corrected. In the case of the present invention, however, because the substrate 1 is warped in its minor-side direction, the substrate 1 is not easily deformed after warped. Even if the substrate 1 is slightly deformed, the cooling period is unnecessary because a deformation for lowering the conveying characteristic of the substrate 1, that is, a deformation in the major-side direction of the substrate 1 does not easily occur. Therefore, the time for deformation becomes approx. 1 sec and thereby, the throughput is not lowered.

In the case of this embodiment, the substrate 1 on which the semiconductor element 8 is not mounted is warped by pressing the substrate 1. However, the substrate 1 on which the semiconductor element 8 is not mounted may be warped by pressing the substrate 1.

In the case of this embodiment, the substrate 1 on which the semiconductor element 8 does not mounted is warped by pressing the substrate 1. However, the substrate 1 on which the semiconductor element 8 mounted may be warped by pressing the substrate 1.

(Third Embodiment)

In the case of this embodiment, a substrate 1 is warped in its minor side direction 1b by conveying a semiconductor device substrate 10b in the direction shown by an arrow 11 while pressing a pressing head 90 from the direction shown by an arrow 91. That is, the method according to this embodiment is different from the method according to the second embodiment shown in FIG. 8 in that the substrate 1 is warped while pressing a point of the substrate 1 and conveying the substrate 1.

Even the semiconductor device substrate and semiconductor device fabrication method according to this embodiment first have the same advantages as those of the semiconductor device substrate and its fabrication method shown in the second embodiment. Moreover, because a step of warping a substrate is simple and an operation state is visible, it is possible to easily confirm the operation for forming a warp.

(Fourth Embodiment)

Figure 9:
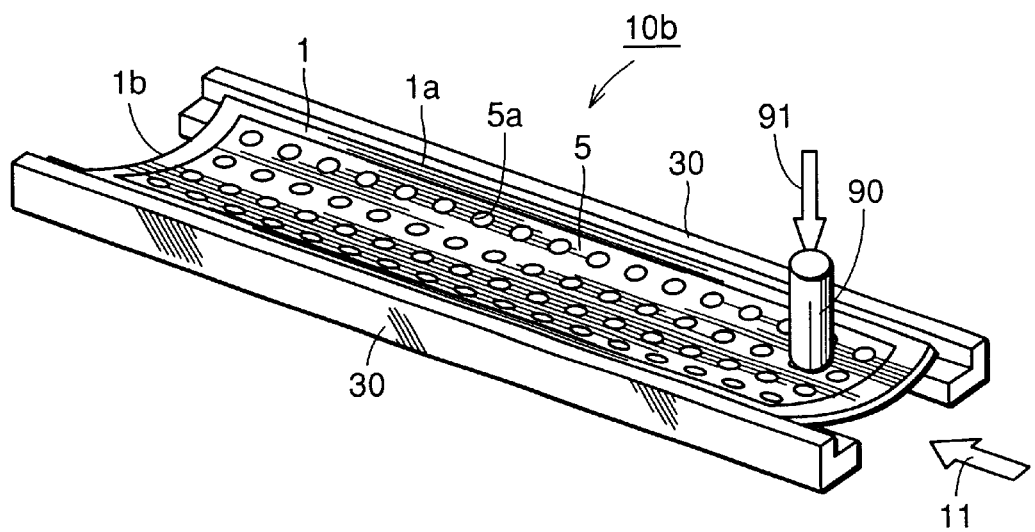
FIG. 9 is a perspective view for explaining a semiconductor device substrate and a semiconductor device fabrication method using the substrate according to a third embodiment of the present invention.
Figure 10:
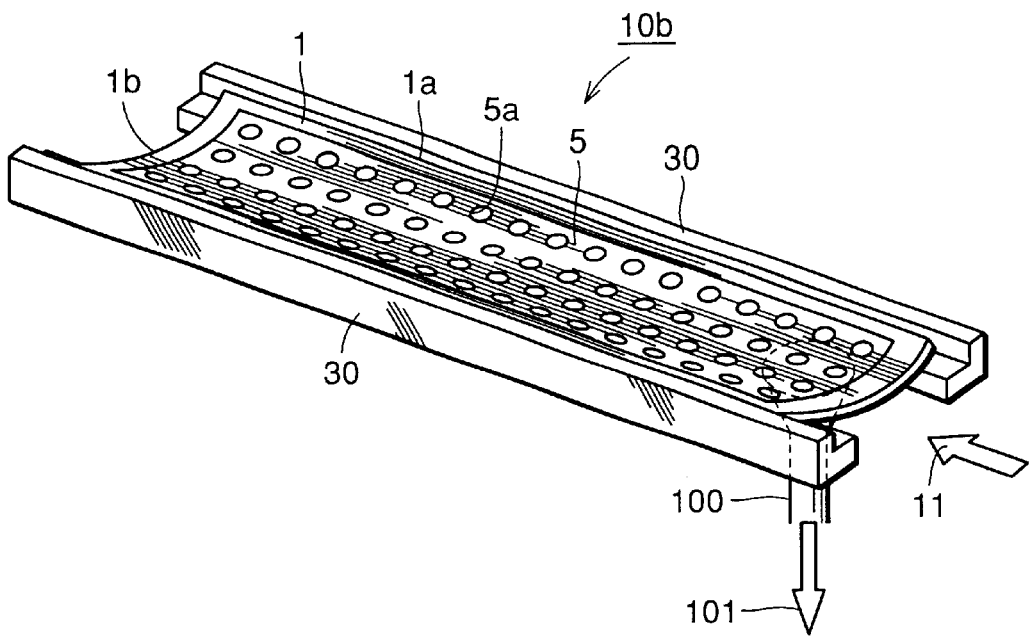
FIG. 10 is a perspective view for explaining a semiconductor device substrate and a semiconductor device fabrication method using the substrate according to a fourth embodiment of the present invention.
Figure 11:
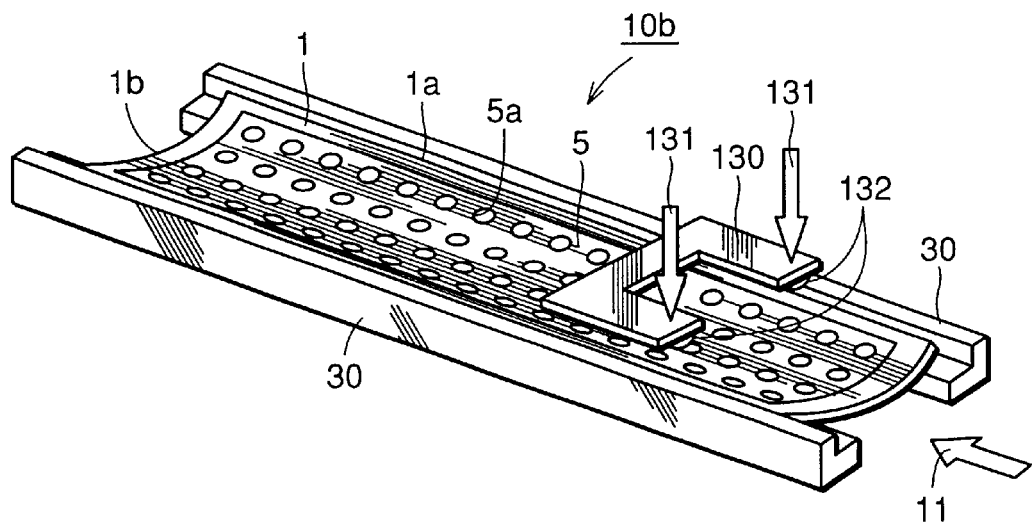
FIG. 11 is a perspective view for explaining a semiconductor device substrate and a semiconductor device fabrication method using the substrate according to a fifth embodiment of the present invention.

The method according to this embodiment is different from the methods according to the second and third embodiments in that the back of a substrate 1 is attracted by an attraction head 100 from the direction shown by an arrow 101 to warp the substrate 1 along its minor-side direction 1b. To warp the substrate 1 through attraction, the substrate 1 may be bent in its longitudinal direction at a time similarly to the case in FIG. 8. Moreover, as in the case with FIG. 9, the entire substrate 1 may be bent by bending a part of the substrate 1 and conveying the substrate 1 under this bending condition.

The semiconductor device substrate and semiconductor device fabrication method using the substrate first have the same advantages as those of the semiconductor device substrate and semiconductor device fabrication method shown in the second embodiment. Moreover, because the suction force acts on the back of the substrate, a face on which a solder resist is formed (face on which a semiconductor element is mounted) is not damaged.

(Fifth Embodiment)

In the case of this embodiment, a substrate 1 is warped in the direction of its minor side 1b by setting a pressing head 132 to a frame holder 130 and pressing the substrate 1 from the direction shown by an arrow 131 through the pressing head 132. The frame holder 130 uses the frame holder of an existing bonder.

The semiconductor device substrate and semiconductor device fabrication method using the substrate have the same advantages as those of the second embodiment. Moreover, it is possible to apply an external force to the substrate 1 while interlocking with the frame-pressing operation of the existing frame holder and therefore, a new driving source is unnecessary.

(Sixth Embodiment)

Figure 12:
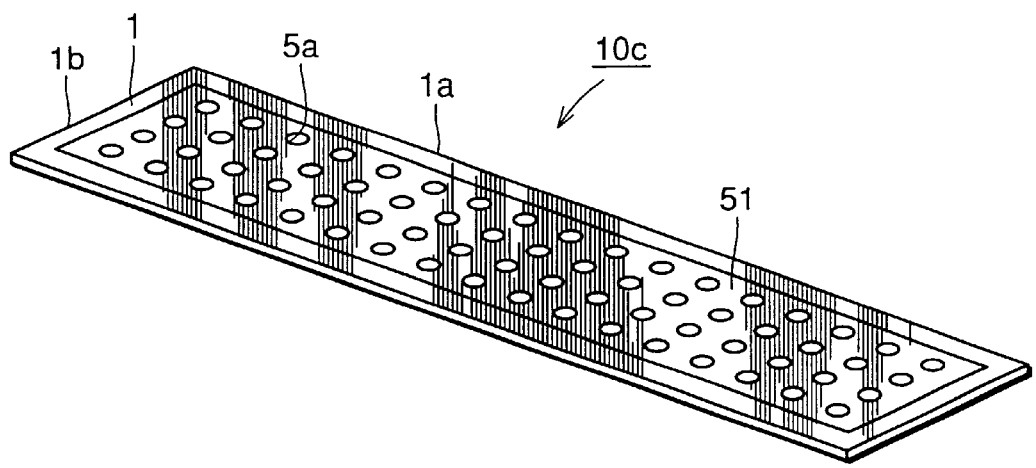
FIG. 12 is a perspective view for explaining a semiconductor device substrate and a semiconductor device fabrication method using the substrate according to a sixth embodiment of the present invention.
Figure 13:
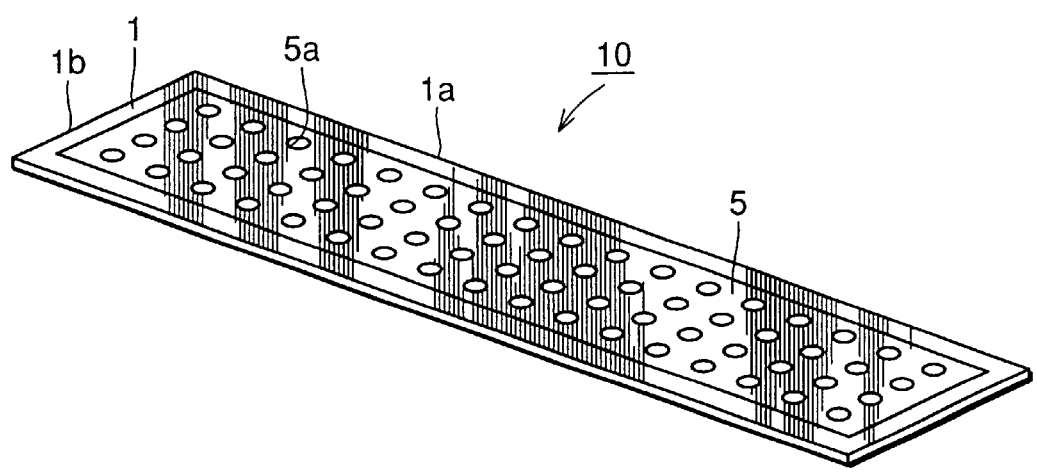
FIG. 13 is a perspective view of a conventional semiconductor device substrate on which a solder resist is formed.
Figure 14:
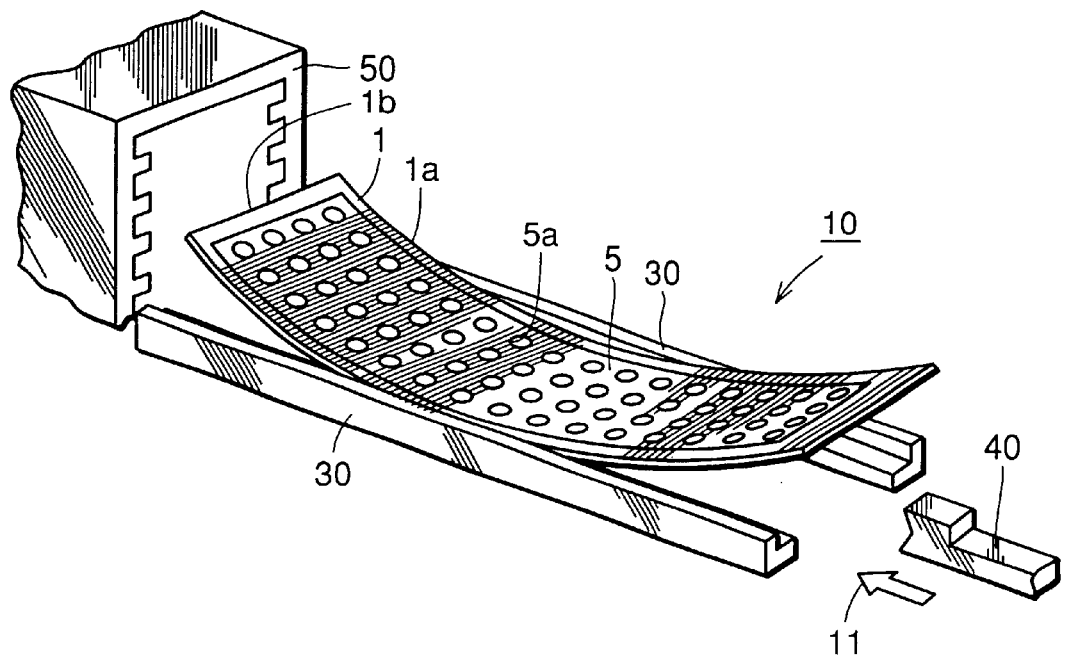
FIG. 14 is a perspective view of a substrate shown to explain problems of the prior art.

Referring to FIG. 12, a semiconductor device substrate 10c according to the sixth embodiment of the present invention is different from that according to the first embodiment in that a solder resist 51 has a linear expansion coefficient of $9 \times 10^{-6}$ to $12 \times 10^{-6}/°$ C. which is smaller than the linear expansion coefficient of the solder resist 5 of the first embodiment. Moreover, linear expansion coefficients of the substrate 1 in its major-side direction 1a and in its minor-side direction 1b are set to 9 to $12 \times 10^{-6}/°$ C. This setting method makes it possible to adjust a linear expansion coefficient by adjusting densities of the glass fibers 1d and 1e in the substrate 1 as shown in FIG. 1.

The semiconductor device substrate 10c is provided with the plate-shaped substrate 1 containing an organic matter and a solder resist 51 formed on the surface of the substrate 1 to serve as a layer having a linear expansion coefficient almost equal to that of the substrate 1. The semiconductor device substrate 1c is conveyed in a predetermined direction.

Though various materials are considered as those of the solder resist 51, it is particularly preferable to use polyimide resin whose linear expansion coefficient can be easily adjusted as a solder resist.

In the case of the semiconductor device substrate thus constituted and the semiconductor device fabrication method, because the linear expansion coefficient of the solder resist 51 is almost equal to that of the substrate 1, the substrate 1 is not warped even after heating and cooling. As a result, a jig and personnel for planarizing a warped substrate are unnecessary and it is possible to prevent the fabrication cost from increasing.

Moreover, because a mechanism for eliminating a warp is unnecessary, it is possible to simplify a conveying mechanism and moreover decrease the mechanism in size and price. Furthermore, it is possible to reduce the energy for driving the conveying mechanism.

Furthermore, because the substrate 1 is not warped even if its thickness is decreased, it is possible to decrease the substrate 1 in thickness and decrease a semiconductor package in thickness, size, and weight.

Furthermore, because a process for correcting a warp is absent, a mechanism for correction is unnecessary. Furthermore, because the process for collecting a warp is absent, the time for correction is unnecessary and the throughput is not lowered. Furthermore, because a process for correcting a warp is absent, the substrate 1, a semiconductor element 8 to be mounted on the substrate 1, and a conductive layer 3 for connecting the substrate 1 with the semiconductor element 8 are not damaged or stressed.

Embodiments of the present invention are described above. They can be variously modified. First, in the case of the first embodiment, the conductive layer 3 is connected with the semiconductor element 8 by the solder 7. However, the connection method is not restricted to solder. For example, the semiconductor element 8 may also be connected with the conductive layer 3 by a bonding wire.

Moreover, it is possible to optionally set the position of the hole 5a in FIG. 5 in accordance with the shape and size of a semiconductor element to be mounted.

Furthermore, though the substrate 1 uses a glass-epoxy substrate, not limited to this, a substrate not containing glass fibers but made of an organic matter such as a substrate made of epoxy resin or acrylic resin may also be used.

According to the present invention, it is possible to provide a semiconductor device substrate that can be easily conveyed and a semiconductor device fabrication method using the substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device fabrication method comprising:
   on a plate-shaped substrate having major and minor sides, containing organic matter, and having a linear expansion coefficient B along the minor side of said substrate and a linear expansion coefficient C, different from B, along the major side of said substrate, forming a layer having a linear expansion coefficient A different from the linear expansion coefficient B;
   warping said substrate, on which said layer is formed, in a direction along the minor-side; and
   conveying said substrate after warping.

2. The semiconductor device fabrication method according to claim 1, including, before forming said layer, adjusting the linear expansion coefficients of said substrate so that the difference between the linear expansion coefficient A of said layer and the linear expansion coefficient B of said substrate is larger than the difference between the linear expansion coefficient A of said layer and the linear expansion coefficient C of said substrate.

3. The semiconductor device fabrication method according to claim 2, wherein adjusting the linear expansion coefficients of said substrate includes, in manufacturing said substrate, aligning a plurality of first fibers with the major side of said substrate and aligning a plurality of second fibers with the minor side of said substrate and adjusting densities of said first and second fibers within said substrate.

4. The semiconductor device fabrication method according to claim 3, wherein said first and second fibers are glass fibers and said substrate includes an epoxy resin matrix covering said glass fibers.

5. The semiconductor device fabrication method according to claim 1, wherein warping said substrate includes pressing said substrate.

6. The semiconductor device fabrication method according to claim 1, wherein warping said substrate includes attracting said substrate.

7. The semiconductor device fabrication method according to claim 5, wherein warping said substrate includes heating and cooling said substrate.

8. The semiconductor device fabrication method according to claim 1, further comprising forming a conductive layer on said substrate before forming said layer, wherein forming said layer includes exposing a part of said conductive layer.

9. A semiconductor device fabrication method comprising:

manufacturing a plate-shaped substrate containing organic matter, having linear expansion coefficients, having major and minor sides, and adjusting the linear expansion coefficients of said substrate along directions of the major and minor sides by arranging a plurality of first fibers extending along the direction of the major side of said substrate and plurality of second fibers extending along the direction of the minor side of said substrate and adjusting respective densities of said first and second fibers;

on said plate-shaped substrate, forming a layer having a linear expansion coefficient almost equal to that of said substrate; and conveying said substrate on which said layer is formed.

10. The semiconductor device fabrication method according to claim 9, wherein said layer contains polyimide resin.

11. The semiconductor device fabrication method according to claim 9, wherein said first and second fibers are glass fibers and said substrate contains an epoxy resin matrix covering said glass fibers.

12. The semiconductor device fabrication method according to claim 9, further comprising forming a conductive layer on said substrate before forming said layer, wherein forming said layer includes exposing a part of said conductive layer.

* * * * *